United States Patent
Koo et al.

(10) Patent No.: US 8,125,247 B2
(45) Date of Patent: Feb. 28, 2012

(54) COMPLEMENTARY SPIN TRANSISTOR LOGIC CIRCUIT

(75) Inventors: Hyun Cheol Koo, Seoul (KR); Suk Hee Han, Seoul (KR); Joon Yeon Chang, Seoul (KR); Hyung Jun Kim, Seoul (KR); Jun Woo Choi, Busan (KR)

(73) Assignee: Korea Institute of Science and Technology, Seoul (KR)

( * ) Notice: Subject to any disclaimer, the term of this patent is extended or adjusted under 35 U.S.C. 154(b) by 0 days.

(21) Appl. No.: 12/899,778

(22) Filed: Oct. 7, 2010

(65) Prior Publication Data
US 2011/0279146 A1 Nov. 17, 2011

(30) Foreign Application Priority Data
May 12, 2010 (KR) .................. 10-2010-0044330

(51) Int. Cl.
*H03K 19/091* (2006.01)
*H01L 21/02* (2006.01)
(52) U.S. Cl. ........................ 326/100; 257/295
(58) Field of Classification Search .............. 326/100; 257/295, 30, 421, 350; 438/624, 3
See application file for complete search history.

(56) References Cited

U.S. PATENT DOCUMENTS

| | | | |
|---|---|---|---|
| 5,654,566 A | 8/1997 | Johnson | |
| 7,307,299 B2 * | 12/2007 | Koo et al. | 257/288 |
| 7,411,235 B2 * | 8/2008 | Saito et al. | 257/295 |
| 7,608,901 B2 * | 10/2009 | Koo et al. | 257/421 |
| 7,652,315 B2 * | 1/2010 | Saito et al. | 257/295 |
| 8,004,029 B2 * | 8/2011 | Saito et al. | 257/295 |
| 2004/0178460 A1 | 9/2004 | Lee et al. | |
| 2005/0282379 A1 * | 12/2005 | Saito et al. | 438/624 |
| 2006/0114018 A1 | 6/2006 | Sugahara et al. | |
| 2007/0059877 A1 * | 3/2007 | Koo et al. | 438/213 |
| 2008/0169492 A1 * | 7/2008 | Koo et al. | 257/295 |
| 2008/0283888 A1 * | 11/2008 | Saito et al. | 257/295 |
| 2009/0152606 A1 | 6/2009 | Koo et al. | |
| 2009/0236646 A1 * | 9/2009 | Sugahara et al. | 257/295 |
| 2010/0090262 A1 * | 4/2010 | Saito et al. | 257/295 |
| 2010/0176428 A1 * | 7/2010 | Hong et al. | 257/295 |

FOREIGN PATENT DOCUMENTS

| | | |
|---|---|---|
| KR | 0511077 | 8/2005 |
| KR | 0789044 | 12/2007 |
| KR | 2009-0062601 | 6/2009 |

* cited by examiner

*Primary Examiner* — Shawki S Ismail
*Assistant Examiner* — Thienvu Tran
(74) *Attorney, Agent, or Firm* — Renner, Otto, Boisselle & Sklar, LLP

(57) ABSTRACT

There is provided a complementary spin transistor logic circuit, including: a parallel spin transistor that includes a magnetized first source, a first drain magnetized in parallel with the magnetization direction of the first source, a first channel layer and a first gate electrode; and an anti-parallel spin transistor that includes a magnetized second source, a second drain magnetized in anti-parallel with the magnetization direction of the second source, a second channel layer and a second gate electrode, wherein the first gate electrode and the second gate electrode are connected to a common input terminal.

19 Claims, 8 Drawing Sheets

COMPLEMENTARY SPIN TRANSISTOR LOGIC CIRCUIT

CROSS-REFERENCE TO RELATED APPLICATIONS

This application claims the priority of Korean Patent Application No. 10-2010-44330 filed on May 12, 2010, in the Korean Intellectual Property Office, the disclosure of which is incorporated herein by reference.

BACKGROUND OF THE INVENTION

1. Field of the Invention

The present invention relates to a logic circuit, and more specifically, to a complementary spin transistor logic circuit.

2. Description of the Related Art

A semiconductor based logic device is the most important and value-added product in an integrated circuit performing complex functions. As a result, many research groups and companies are carrying out research into a semiconductor based logic device. The logic device, which is a fundamental device performing various operations, is a core device leading the semiconductor market, together with a memory device. The most frequently used logic circuit for electronic devices is a complementary MOS logic circuit based on a metal oxide semiconductor field effect transistor (MOSFET). The complementary MOS logic circuit is advantageous in that it has a fast switching speed and low power consumption. The recent trend in semiconductor devices is miniaturization and multifunctionality. The miniaturization and multifunctionality of semiconductor devices are associated with each other. The known silicon-based complementary MOS (CMOS) technology has a limitation in that size reduction needs a lot of cost. Therefore, a need exists for a new device and a circuit capable of performing various functions.

SUMMARY OF THE INVENTION

An aspect of the present invention provides a complementary spin transistor logic circuit having low power consumption, fast processing, as well as being nonvolatile and having multi switching characteristics that belong to spin.

An aspect of the present invention also provides a complementary spin transistor logic circuit capable of performing a memory function while being used in a multifunctional logic circuit.

According to an aspect of the present invention, there is provided a complementary spin transistor logic circuit, including: a parallel spin transistor that includes a magnetized first source, a first drain magnetized in parallel with the magnetization direction of the first source, a first channel layer that is disposed between the first source and the first drain and transfers electrons to the first drain by injecting spin-polarized electrons from the first source, and a first gate electrode that is disposed on the upper portion of the first channel layer and controls the spin of electrons passing through the first channel layer, the electrons making precession by a spin-orbit coupling induced magnetic field according to voltage applied to the first gate electrode when passing through the first channel layer; and an anti-parallel spin transistor that includes a magnetized second source, a second drain magnetized in anti-parallel with the magnetization direction of the second source, a second channel layer that is disposed between the second source and the second drain on a second substrate and transfers electrons to the second drain by injecting spin-polarized electrons from the second source, and a second gate electrode that is disposed on the upper portion of the second channel layer and controls the spin of electrons passing through the second channel layer, the electrons making precession by the spin-orbit coupling induced magnetic field according to voltage applied to the second gate electrode when passing through the second channel layer, wherein the first gate electrode and the second gate electrode are connected to a common input terminal.

The second drain and the first source may be electrically connected to each other and the second drain and the first source may be connected to an output terminal outputting signals.

The second source may be connected to a ground and the first drain may be connected to a positive voltage.

One of the parallel spin transistor and the anti-parallel transistor may be turned-on and the other thereof may be turned-off when the same voltage is applied to the first gate electrode and the second gate electrode.

The first source and the second source may be made of any one ferromagnetic material selected from a group consisting of CoFe, Co, Ni, and NiFe, or a mixture thereof.

The first drain and the second drain may be made of any one ferromagnetic material selected from a group consisting of CoFe, Co, Ni, and NiFe, or a mixture thereof.

The first source and the second source may be made of any one magnetic semiconductor selected from a group consisting of GaAs, MnAs, InAs, and MnAs, or a mixture thereof.

The first drain and the second drain may be made of any one magnetic semiconductor selected from a group consisting of GaAs, MnAs, InAs, and MnAs, or a mixture thereof.

The first channel layer and the second channel layer may be two-dimensional electron gas.

The first channel layer and the second channel layer may be made of any one material selected from a group consisting of GaAs, InAs, InGaAs, InSb, or a mixture of at least two thereof.

The first channel layer and the second channel layer may be made of any one material selected from a group consisting of Au, Pt, Ag, Al, Cu, Sb, graphene, or a mixture of at least two thereof.

The complementary spin transistor logic circuit may further include an insulating layer between the first substrate and the first channel layer.

The complementary spin transistor logic circuit may further include an insulating layer between the second substrate and the second channel layer.

The insulating layer may be made of any one material selected from a group consisting of $SiO_2$, $Al_2O_2$, $TaO_x$, MgO, or a mixture of at least two thereof.

The first channel layer may be n-doped and is ohmic-junctioned or schottky-junctioned with the first source or the first drain.

The second channel layer may be n-doped and is ohmic-junctioned or schottky-junctioned with the second source or the second drain.

The first channel layer or the second channel layer may include a nano-wire.

The complementary spin transistor logic circuit may perform any one operation among a group consisting of an inverter, an OR gate, an AND gate, a NOR gate, an NAND gate, and at least two combinations thereof.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Figure 1:
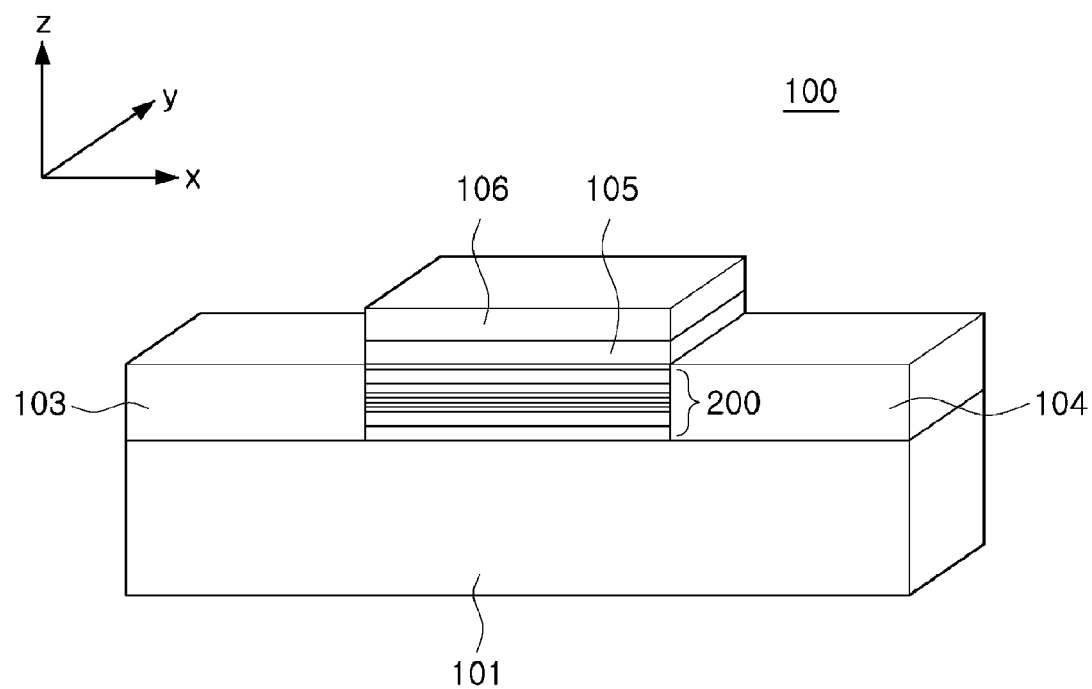
FIG. 1 is a diagram schematically showing a spin transistor according to an exemplary embodiment of the present invention.

Exemplary embodiments of the present invention will now be described in detail with reference to the accompanying drawings. However, it should be noted that the spirit of the present invention is not limited to the embodiments set forth herein and those skilled in the art and understanding the present invention can easily accomplish retrogressive inventions or other embodiments included in the spirit of the present invention by the addition, modification, and removal of components within the same spirit, and those are to be construed as being included in the spirit of the present invention.

Further, throughout the drawings, the same or similar reference numerals will be used to designate the same components or like components having the same functions in the scope of the similar idea.

Figure 2:
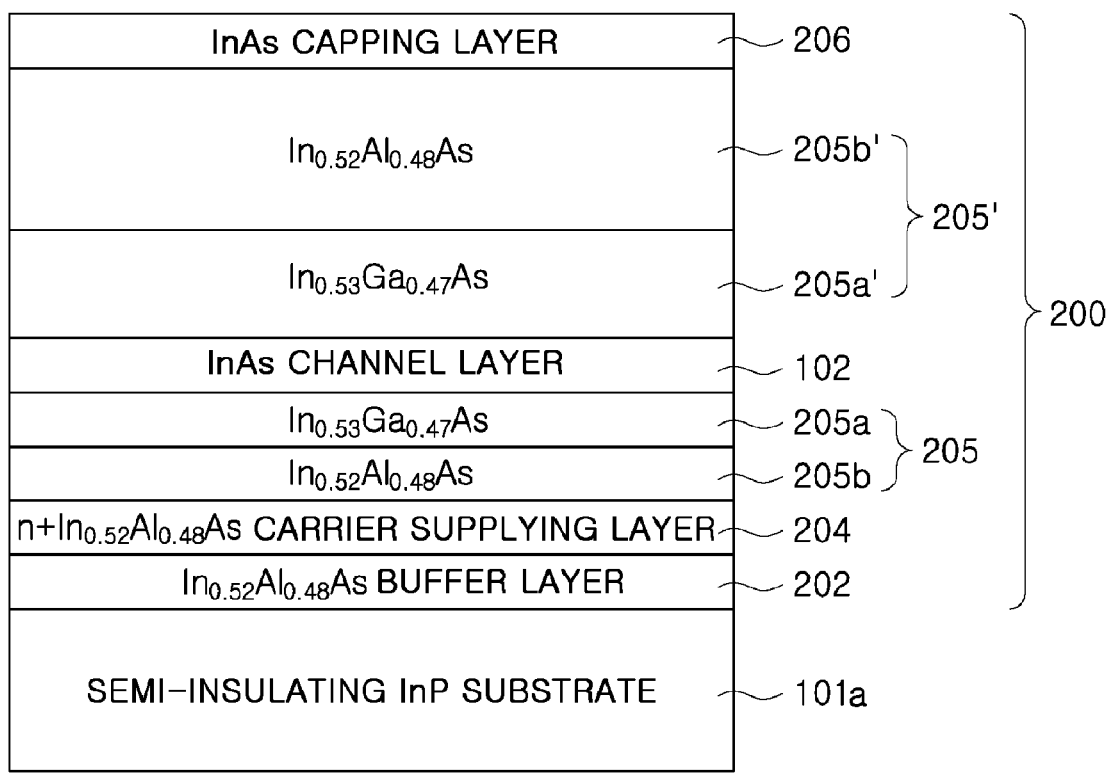
FIG. 2 is a cross-sectional view showing a channel structure and a substrate according to an exemplary embodiment of the present invention.

FIG. 1 is a diagram schematically showing a spin transistor according to an exemplary embodiment of the present invention. Referring to FIG. 1, the spin transistor includes a semiconductor substrate 101, a channel structure 200, a source 103, a drain 104, a gate insulating layer 105, and a gate electrode 106. The source 103 is disposed on the semiconductor substrate 101 and injects spin-polarized electrons into the channel structure 200 through the source 103. The source 103 may be made of a ferromagnetic material, such as CoFe, Co, Ni, NiFe, or the like, or a mixture thereof. As another example, the source 103 may be made of a magnetic semiconductor, such as GaAs, MnAs, InAs, MnAs, or a mixture thereof. The magnetization direction of the source 103 may be +x direction. The drain 104 is disposed on the semiconductor substrate 101 and injects the spin-polarized electrons passing through the channel structure 200 into the drain 104. The drain 104 is made of a ferromagnetic material and the magnetization direction may be +x direction in parallel with the magnetization direction of the source 103. Alternatively, the magnetization direction of the drain 104 may be −x direction in anti-parallel with the magnetization direction of the source 103. The drain 104 may be made of a ferromagnetic material, such as CoFe, Co, Ni, NiFe, or the like, or a mixture thereof. As another example, the drain 104 may be made of a magnetic semiconductor, such as GaAs, MnAs, InAs, MnAs, or a mixture thereof. The gate electrode 106 is disposed on the source 103, the drain 104, and the channel structure 200 and controls the spin of electrons passing through the channel layer included in the channel structure 200. The channel structure 200 is disposed between the source 103 and the drain 104 that are disposed on the semiconductor substrate 101. The channel layer of the channel structure 200 may be two-dimensional electron gas. Although the two-dimensional electron gas may be implemented variously, the specification describes a multi-layer channel structure including the channel layer of InAs as shown in FIG. 2. The electrons make precession by spin-orbit coupling induced magnetic field according to voltage applied to the gate electrode at the time of passing through the channel layer.

FIG. 2 is a cross-sectional view showing a channel structure and a substrate according to an exemplary embodiment of the present invention. Referring to FIG. 2, the channel structure 200 is disposed on a semi-insulating InP substrate 101 and includes an InAlAs buffer layer 202, an n-doped InAlAs carrier supplying layer 204, an undoped InGaAs/InAlAs lower cladding layer 205, an InAs channel layer 102, an undoped InAlAs/InGaAs upper cladding layer 205', and an InAs capping layer 206 that are stacked sequentially.

Each of the lower and upper cladding layers 205 and 205' is configured of a double cladding structure that is configured to include the undoped InGaAs layer and the InAlAs layer. In other words, the lower cladding layer 205 is configured to include a first lower cladding layer 205a made of InGaAs and a second lower cladding layer 205b made of InAlAs that is formed below the first lower cladding layer 205a. In addition, the upper cladding layer 205' is configured to include a first upper cladding layer 205a' made of InGaAs and a second upper cladding layer 205b' made of InAlAs that is formed on the first upper cladding layer 205a'. The second lower cladding layer 205b has an energy band gap larger than the first lower cladding layer 205a and the second upper cladding layer 205b' has an energy band gap larger than the first upper cladding layer 205a'.

The channel layer 102 forms a quantum well by an energy barrier between upper and lower cladding layers 805 and 805'. In particular, electrons are confined to the channel layer 102 by the upper and lower cladding layers 805 and 805' having the double cladding structure, wherein the channel layer 102 may generate the two-dimensional electron gas (2-DEG). The electron mobility is very high in the two-dimensional electron gas, such that the spin transfer distance becomes long. Further, the channel layer 102 may be a nanowire structure. In the present exemplary embodiment, the channel layer 102 is made of InAs; however, the present invention is not limited thereto. As one exemplary embodiment, the channel layer 102 having the two-dimensional electron gas structure may be made of a semiconductor material selected from GaAs, InGaAs, InSb, and InAs, or a mixture thereof. As another embodiment, the channel layer 102 may be made of any one selected from a group consisting of Au, Pt, Ag, Al, Cu, Sb, graphene, or a mixture thereof. In this case, it is preferable to include the insulating layer (not shown) between the substrate 101 and the channel layer 102. The insulating layer may be made of any one material selected from a group consisting of $SiO_2$, $Al_2O_3$, $TaO_x$, MgO, or a mixture thereof. The channel layer 102 may be, for example, n-doped and may be ohmic-junctioned or schottky-junctioned with the source or the drain.

An n-doped InAlAs carrier supplying layer 204 is disposed below the channel layer 102 to supply charge to the channel layer 102, and the InAlAs buffer layer 202 mitigates the lattice disparity between the InP substrate 101 and the lower cladding layer 205. Further, the InAs capping layer 206 on the top of the channel structure 200 serves to prevent the oxidation and degeneration of the channel structure 200 that may occur during the process.

In order to implement the complementary spin transistor logic circuit, a need exists for two types of spin transistors having complementarity similar to an n-type transistor and a p-type transistor that are generally used. One type of spin transistor is a spin transistor whose source and drain have the magnetization direction in parallel with each other. This is called a parallel spin transistor. The other type of spin transistor is a spin transistor whose source and drain have the magnetization direction in anti-parallel with each other. This is called an anti-parallel spin transistor.

Figure 3A:
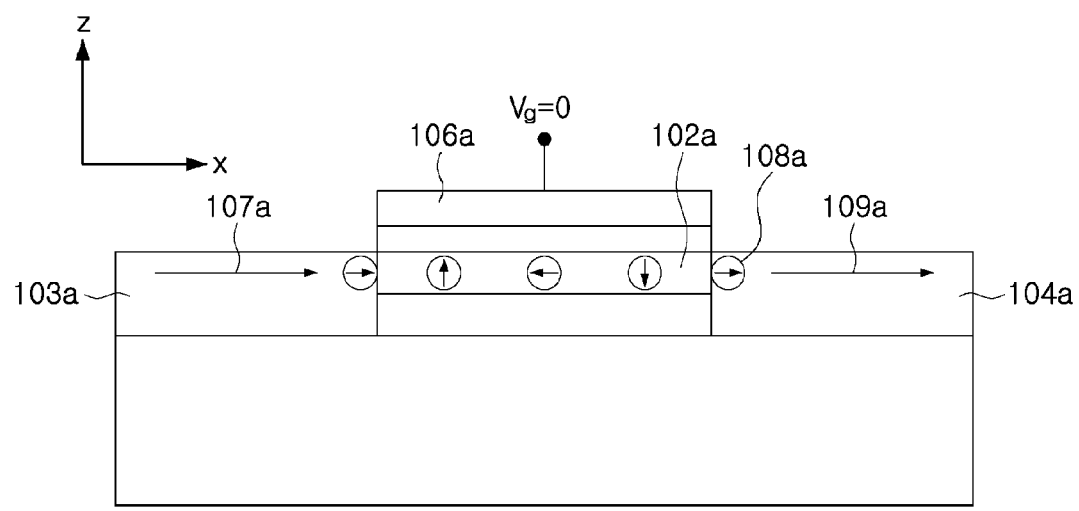
FIG. 3A is a diagram schematically showing an operation when an input voltage of a parallel spin transistor is 0.

FIG. 3A is a diagram schematically showing an operation when an input voltage of a parallel spin transistor is 0 (Vg=0). Referring to FIG. 3A, the magnetization direction 107a of the first source 103a is +x direction and the magnetization direction 109a of the first drain 104a is +x direction, such that they are parallel with each other. The precession angle of the spin of electron input until the spin of electron input from the first source 103a reaches the first drain 104a is determined depending on the distance between the first source 103a and the first drain 104a and the type of the first channel layer 102a and is controlled by the voltage of the first gate electrode 106a. Even when the voltage of the first gate electrode 106a is 0 (Vg=0), the spin of electron has a unique precession angle depending on the distance between the first source 103a and the first drain 104a and the type of the first channel layer 102a. In the case of the parallel spin transistor, the spin of an electron injected from the first source 103a is rotated 360° so that the spin direction 108a of the electron is parallel to the magnetization direction 109a of the first drain 104a as soon as the spin of the electron reaches the first drain 104a, thereby turning-on the parallel spin transistor.

Figure 3B:
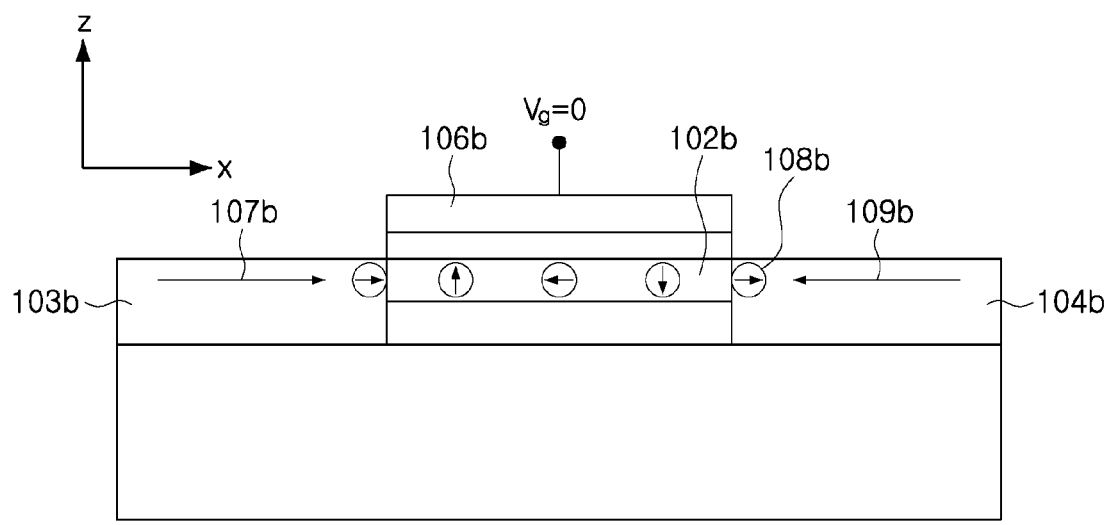
FIG. 3B is a diagram schematically showing an operation when an input voltage of an anti-parallel spin transistor is 0.

FIG. 3B is a diagram schematically showing an operation when an input voltage of an anti-parallel spin transistor is 0 (Vg=0). Referring to FIG. 3B, the magnetization direction 107b of the second source 103b is + x direction and the magnetization direction 109b of the second drain 104b is −x direction, such that they are anti-parallel with each other. The precession angle of the spin of an electron until the spin of the electron input from the second source 103b reaches the second drain 104b is determined depending on the distance between the second source 103b and the second drain 104b and the type of the second channel layer 102b and is controlled by the voltage of the second gate electrode 106b. Even when the voltage of the second gate electrode 106b is 0 (Vg=0), the spin of the electron has a unique precession angle depending on the distance between the second source 103b and the second drain 104b and the type of the second channel layer 102b. The spin of the electron injected from the second source 103b is rotated 360° so that the spin direction 108b of electron is anti-parallel with the magnetization direction 109b of the second drain 104b as soon as the spin of electron reaches the second drain 104b, thereby turning-off the anti-parallel spin transistor.

Figure 4A:
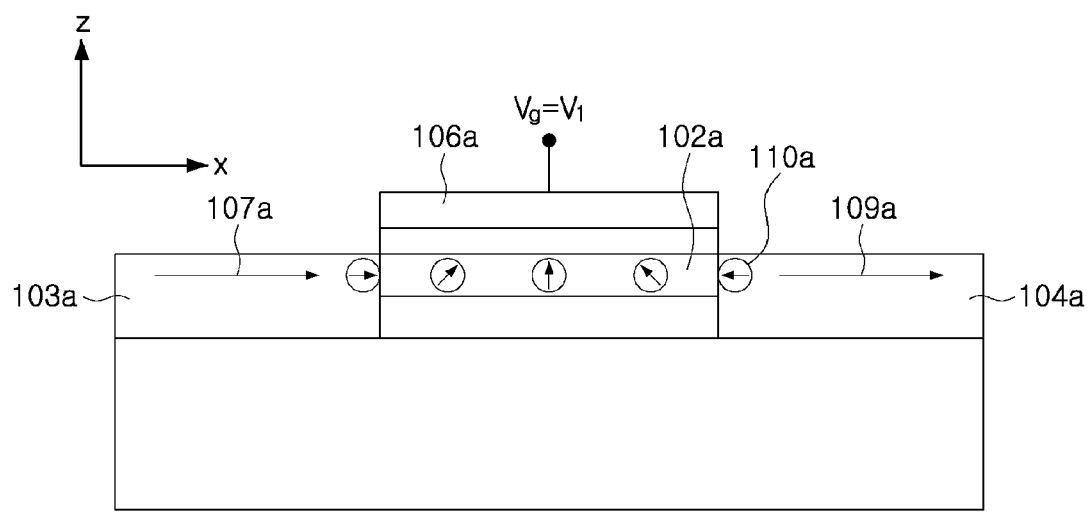
FIG. 4A is a diagram schematically showing an operation when an input voltage of a parallel spin transistor is "High" (Vg=V1)

FIG. 4A is a diagram schematically showing an operation when an input voltage of a parallel spin transistor is "High" (Vg=V1). In other words, FIG. 4A shows that when an electron injected into the first channel layer 102a is input into the first drain 104a, the voltage of the first gate electrode 106a is applied so that the precession angle of spin is 180°. Referring to FIG. 4A, when the spin of electron emitted from the first source 103a reaches the first drain 104a, the direction of spin is anti-parallel with the magnetization direction of the drain, such that the parallel spin transistor is turned-off.

Figure 4B:
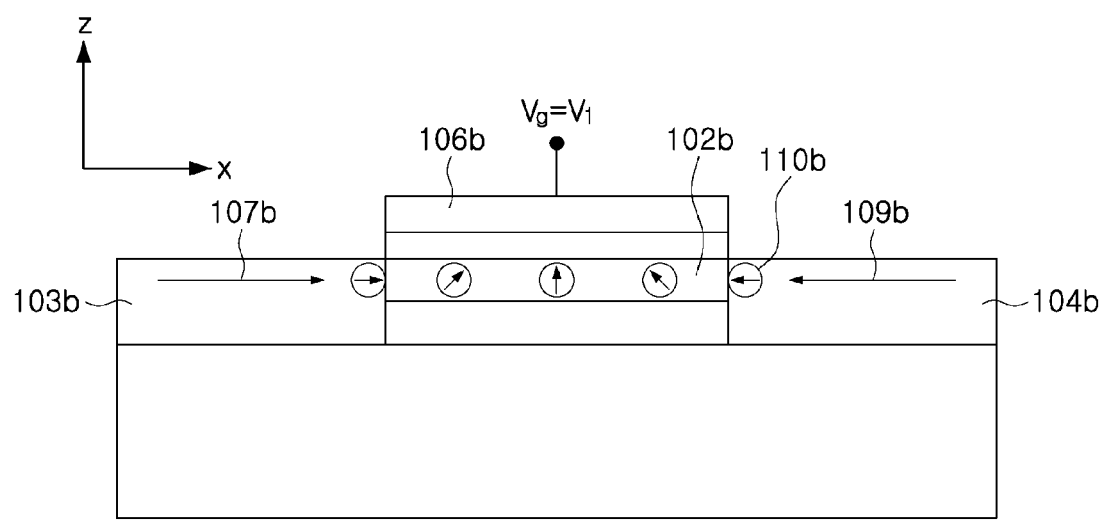
FIG. 4B is a diagram schematically showing an operation when an input voltage of an anti-parallel spin transistor is "High" (Vg=V1)

FIG. 4B is a diagram schematically showing an operation when an input voltage of an anti-parallel spin transistor is "High" (Vg=V1). In other words, FIG. 4B shows that when electrons injected into the second channel layer 102b are input to the second drain 104b, the voltage of the second gate electrode 106b is applied so that the precession angle of spin is 180°. Referring to FIG. 4B, when the spin of electron emitted from the second source 103b reaches the second drain 104b, the spin direction is parallel with the magnetization direction of the second drain 104b, thereby turning-on the anti-parallel spin transistor. At this time, the V1 value may be changed according to the length of the channel layers 102a and 102b or the thickness of the gate insulating layer 105 but is generally about 1V.

As can be appreciated from FIGS. 3A, 3B, 4A, and 4B, when the input voltage is "Low" (Vg=0), only the parallel spin transistor is turned-on and when the input voltage is "High" (Vg=V1), only the anti-parallel spin transistor is turned-on, thereby making it possible to implement the complementary semiconductor. The two types of transistors have different output values when electrons having the spin in a specific direction reach the drain.

Figure 5:
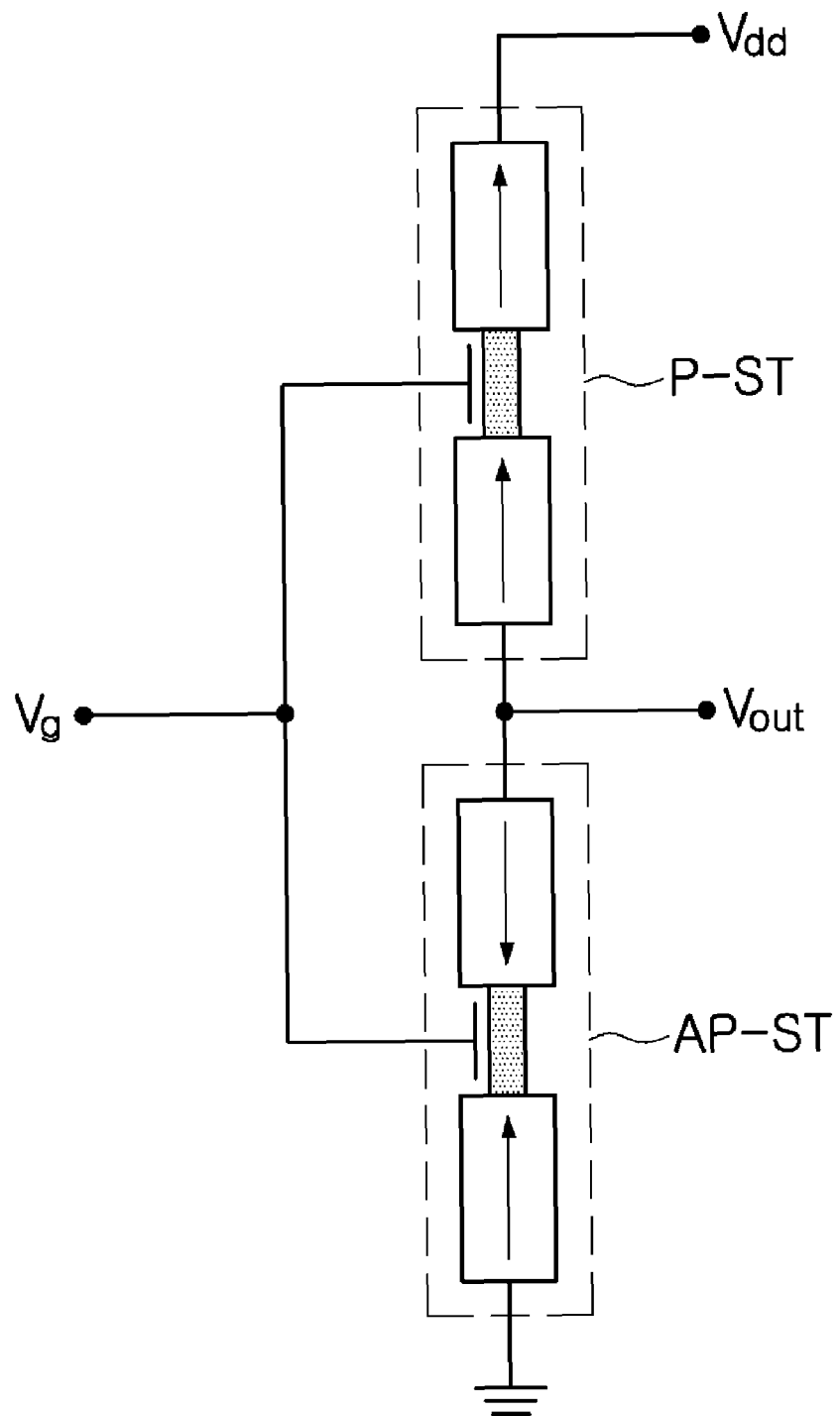
FIG. 5 is a diagram showing an inverter constituted by a complementary spin transistor logic circuit using a parallel spin transistor P-ST and a anti-parallel spin transistor AP-ST.

FIG. 5 is a diagram showing an example of an inverter constituted by a complementary spin transistor logic circuit using a parallel spin transistor P-ST and an anti-parallel spin transistor AP-ST. Referring to FIG. 5, when the input voltage Vg applied to the input terminal is 0 ("Low"), the parallel spin transistor P-ST is turned-on and the anti-parallel spin transistor AP-ST is turned-off, as described above. In this case, the output voltage Vout is connected to Vdd, such that it becomes a "High" state. To the contrary, when the input voltage Vg is V1, the parallel spin transistor P-ST is turned-off and the anti-parallel spin transistor AP-ST is turned-on. In this case, the output voltage Vout of the output terminal is connected to a ground, such that it becomes a "Low" state. As described above, since voltage opposite to the input voltage Vg is constantly output, the function of an inverter is performed. V1 is changed depending on the channel or the gate insulating layer but is generally about 1V.

Figure 6:
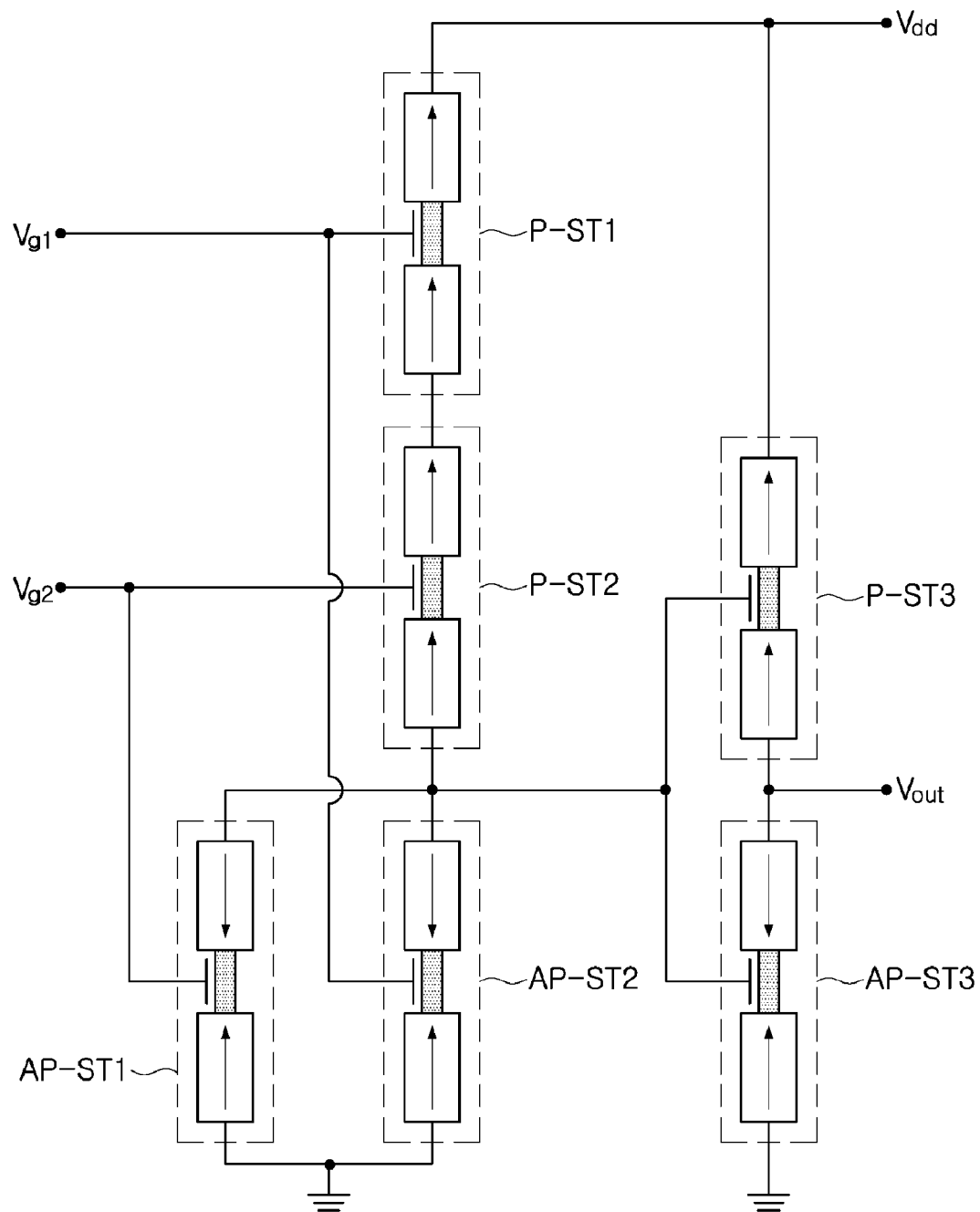
FIG. 6 is a diagram showing an example of an OR gate constituted by the complementary spin transistor logic circuit using the complementary spin transistor.

FIG. 6 is a diagram showing an example of an OR gate constituted by the complementary spin transistor logic circuit using the complementary spin transistor. Referring to FIG. 6, Vg1 and Vg2 are input voltages applied to the input terminal and Vout is an output voltage output to the output terminal. The parallel spin transistors P-ST1, P-ST2, and P-ST3 are turned-on when the input voltage is "Low" and are turned-off when the input voltage is "High" and the anti-parallel spin transistors AP-ST1, AP-ST2, and AP-ST3 are turned-off when the input voltage is "Low" and are turned-on when the input voltage is "High". When Vg1=Vg2=0 ("Low"), both the P-ST1 and P-ST2 are turned-on and both the AP-ST1 and AP-ST2 are turned-off. The input voltage of the AP-ST3 and P-ST3 are connected to the Vdd, such that it becomes "High". In this case, the P-ST3 is turned-off and the AP-ST3 is turned-on such that Vout becomes "Low". When V1 ("High") is input to at least one of Vg1 and Vg2, one or both of the AP-ST1 and AP-ST2 is turned-on, while one or both of the P-ST1 and P-ST2 is turned-off. Therefore, the input voltage of the AP-ST3 and P-ST3 are connected to the ground, such that it becomes "Low". In this case, the P-ST3 is turned-on and the AP-ST3 is turned-off, such that Vout is connected to Vdd to be set to "High". As described above, when comparing the input voltage with the output voltage, it can be appreciated that the circuit of FIG. 6 serves as an OR gate.

The complementary spin transistor logic circuit according to the exemplary embodiment of the present invention includes the parallel spin transistor and the anti-parallel transistor and the first gate electrode and the second gate electrode may be connected to the common input terminal. In addition, the first drain and the second source may be electrically connected to each other and the second drain and the first source may be electrically connected to the output terminal outputting signals. Further, the second source may be connected to the ground and the first drain may be connected to a positive voltage.

The complementary spin transistor logic circuit according to the exemplary embodiment of the present invention may be used for an AND gate, a NOR gate, a NAND gate, and a logic gate that is configured to include at least two combinations thereof, besides the inverter and the OR gate disclosed in the specification.

As set forth above, the present invention can obtain a complementary spin transistor logic circuit having lower power consumption, fast processing, as well as being non-volatile and having multi switching characteristics that belong to spin.

Further, the present invention can obtain the complementary spin transistor logic circuit capable of performing the memory function while being used in the multifunctional logic circuit.

Although preferred embodiments of the present invention have been illustrated and described, the present invention is not limited to the above-mentioned embodiments and various modifications can be made by those skilled in the art without the scope of the appended claims of the present invention. In addition, these modified embodiments should not be appreciated separately in a technical spirit or prospect.

What is claimed is:

1. A complementary spin transistor logic circuit, comprising:
a parallel spin transistor that includes a magnetized first source, a first drain magnetized in parallel with the magnetization direction of the first source, a first channel layer that is disposed between the first source and the first drain and transfers electrons to the first drain by injecting spin-polarized electrons from the first source, and a first gate electrode that is disposed on the upper portion of the first channel layer and controls the spin of electrons passing through the first channel layer, the spin of electrons making precession by a spin-orbit coupling induced magnetic field according to voltage applied to the first gate electrode when passing through the first channel layer; and
an anti-parallel spin transistor that includes a magnetized second source, a second drain magnetized in anti-parallel with the magnetization direction of the second source, a second channel layer that is disposed between the second source and the second drain on a second substrate and transfers electrons to the second drain by injecting spin-polarized electrons from the second source, and a second gate electrode that is disposed on the upper portion of the second channel layer and controls the spin of electrons passing through the second channel layer, the spin of electrons making precession by the spin-orbit coupling induced magnetic field according to voltage applied to the second gate electrode when passing through the second channel layer,
wherein the first gate electrode and the second gate electrode are connected to a common input terminal.

2. The complementary spin transistor logic circuit of claim 1, wherein the second drain and the first source are electrically connected to each other and the second drain and the first source are connected to an output terminal outputting signals.

3. The complementary spin transistor logic circuit of claim 1, wherein the second source is connected to a ground and the first drain is connected to a positive voltage.

4. The complementary spin transistor logic circuit of claim 1, wherein one of the parallel spin transistor and the anti-parallel transistor is turned-on and the other thereof is turned-off when the same voltage is applied to the first gate electrode and the second gate electrode.

5. The complementary spin transistor logic circuit of claim 1, wherein the first source and the second source are made of any one ferromagnetic material selected from a group consisting of CoFe, Co, Ni, and NiFe, or a mixture thereof.

6. The complementary spin transistor logic circuit of claim 1, wherein the first drain and the second drain are made of any one ferromagnetic material selected from a group consisting of CoFe, Co, Ni, and NiFe, or a mixture thereof.

7. The complementary spin transistor logic circuit of claim 1, wherein the first source and the second source are made of any one magnetic semiconductor selected from a group consisting of GaAs, MnAs, InAs, and MnAs, or a mixture thereof.

8. The complementary spin transistor logic circuit of claim 1, wherein the first drain and the second drain are made of any one magnetic semiconductor selected from a group consisting of GaAs, MnAs, InAs, and MnAs, or a mixture thereof.

9. The complementary spin transistor logic circuit of claim 1, wherein the first channel layer and the second channel layer are two-dimensional electron gas.

10. The complementary spin transistor logic circuit of claim 9, wherein the first channel layer and the second channel layer are made of any one material selected from a group consisting of GaAs, InAs, InGaAs, InSb, or a mixture of at least two thereof.

11. The complementary spin transistor logic circuit of claim 1, wherein the first channel layer and the second channel layer are made of any one material selected from a group consisting of Au, Pt, Ag, Al, Cu, Sb, graphene, or a mixture of at least two thereof.

12. The complementary spin transistor logic circuit of claim 11, further comprising an insulating layer between the first substrate and the first channel layer.

13. The complementary spin transistor logic circuit of claim 12, wherein the insulating layer is made of any one material selected from a group consisting of $SiO_2$, $Al_2O_3$, $TaO_x$, MgO, or a mixture of at least two thereof.

14. The complementary spin transistor logic circuit of claim 11, further comprising an insulating layer between the second substrate and the second channel layer.

15. The complementary spin transistor logic circuit of claim 14, wherein the insulating layer is made of any one material selected from a group consisting of $SiO_2$, $Al_2O_3$, $TaO_x$, MgO, or a mixture of at least two thereof.

16. The complementary spin transistor logic circuit of claim 1, wherein the first channel layer is n-doped and is ohmic-junctioned or schottky-junctioned with the first source or the first drain.

17. The complementary spin transistor logic circuit of claim 1, wherein the second channel layer is n-doped and is ohmic-junctioned or schottky-junctioned with the second source or the second drain.

18. The complementary spin transistor logic circuit of claim 1, wherein the first channel layer or the second channel layer includes a nano-wire.

19. The complementary spin transistor logic circuit of claim 1, wherein the complementary spin transistor logic circuit performs any one operation among a group consisting of an inverter, an OR gate, an AND gate, a NOR gate, an NAND gate, and at least two combinations thereof.

* * * * *